(12) United States Patent
Kazuno et al.

(10) Patent No.: US 11,858,226 B2
(45) Date of Patent: Jan. 2, 2024

(54) METHOD OF MANUFACTURING ELECTRONIC DEVICE

(71) Applicant: SEIKO EPSON CORPORATION, Tokyo (JP)

(72) Inventors: Masataka Kazuno, Kofu (JP); Kenji Yamamoto, Matsumoto (JP); Ryosuke Takahashi, Asahi-mura (JP)

(73) Assignee: Seiko Epson Corporation, Tokyo (JP)

( * ) Notice: Subject to any disclaimer, the term of this patent is extended or adjusted under 35 U.S.C. 154(b) by 636 days.

(21) Appl. No.: 16/786,148

(22) Filed: Feb. 10, 2020

(65) Prior Publication Data

US 2020/0254704 A1 Aug. 13, 2020

(30) Foreign Application Priority Data

Feb. 13, 2019 (JP) ................. 2019-023867

(51) Int. Cl.
  *B29C 70/68* (2006.01)
  *H01B 13/00* (2006.01)
  *B29L 31/34* (2006.01)
  *B29K 63/00* (2006.01)

(52) U.S. Cl.
  CPC ....... *B29C 70/683* (2013.01); *H01B 13/0036* (2013.01); *B29K 2063/00* (2013.01); *B29L 2031/34* (2013.01)

(58) Field of Classification Search
  CPC ........ B29C 70/683; B29C 2045/14237; H01B 13/0036; H01L 21/4842; H01L 23/49575; H01L 23/49551

USPC .......................................................... 29/874
See application file for complete search history.

(56) References Cited

U.S. PATENT DOCUMENTS

| | | | |
|---|---|---|---|
| 8,537,567 B2 * | 9/2013 | Otsuki | H01L 23/49555 361/813 |
| 9,929,201 B2 * | 3/2018 | Yoneyama | H05K 1/118 |
| 2001/0011472 A1 * | 8/2001 | Sato | H01L 21/4842 72/381 |
| 2010/0302756 A1 | 12/2010 | Otsuki | |
| 2016/0358965 A1 | 12/2016 | Suyama et al. | |

FOREIGN PATENT DOCUMENTS

| | | |
|---|---|---|
| CN | 106031150 | 10/2016 |
| JP | 2001-150030 | 6/2001 |
| JP | 2010-278186 | 12/2010 |

* cited by examiner

*Primary Examiner* — Matthew J Daniels
*Assistant Examiner* — Hana C Page
(74) *Attorney, Agent, or Firm* — WORKMAN NYDEGGER

(57) ABSTRACT

A method of manufacturing an electronic device in which an electronic component coupled to a lead is covered with a mold cover, includes: a coupling step of coupling the electronic component to the lead, a bending step of bending the lead to adjust a posture of the electronic component, and a molding step of molding the electronic component with a resin material to form the mold cover, and the bending step includes a lead bending step of bending the lead by pressing a pressing member against the lead without pressing the pressing member against the electronic component.

4 Claims, 9 Drawing Sheets

METHOD OF MANUFACTURING ELECTRONIC DEVICE

The present application is based on, and claims priority from JP Application Serial Number 2019-023867, filed Feb. 13, 2019, the disclosure of which is hereby incorporated by reference herein in its entirety.

BACKGROUND

1. Technical Field

The present disclosure relates to a method of manufacturing an electronic device.

2. Related Art

JP A-2010-278186 describes an electronic device in which an angular velocity sensor that detects an angular velocity around an X axis, an angular velocity sensor that detects an angular velocity around a Y axis, and an angular velocity sensor that detects an angular velocity around a Z axis are respectively molded by a resin package in a state of being fixed to respective leads.

Although JP A-2010-278186 describes a method of bending the lead by 90°, only "applying a force from a bottom to a top using a mold or the like" is described, and it is difficult to bend a lead frame by 90° with high accuracy.

SUMMARY

An aspect of the present disclosure is directed to a method of manufacturing an electronic device in which an electronic component coupled to a lead is covered with a mold cover, and the method of manufacturing an electronic device includes: a coupling step of coupling a first electronic component to a first lead; a bending step of bending the first lead to adjust a posture of the first electronic component; and a molding step of molding the first electronic component with a resin material to form the mold cover, in which the bending step includes a lead bending step of bending the first lead by pressing a pressing member against the first lead without pressing the pressing member against the first electronic component.

In the aspect of the present disclosure, the bending step may include: a first step of bending the first lead to an angle less than a target angle, and a second step of bending the first lead to the target angle, in which the second step may be performed in the lead bending step.

In the aspect of the present disclosure, in the first step, the first lead may be bent to the angle less than the target angle by pressing the pressing member against the first electronic component.

In the aspect of the present disclosure, the first step may be performed a plurality of times.

In the aspect of the present disclosure, the electronic device may further include: a second electronic component; and a second lead coupled to the second electronic component, in the coupling step, the first electronic component may be coupled to the first lead, the second electronic component may be coupled to the second lead, and the first electronic component and the second electronic component may be arranged in a plane, in the bending step, by pressing the pressing member against the first lead without pressing the pressing member against the first electronic component, the first lead may be bent to set the first electronic component to a target posture, and by pressing the pressing member against the second lead without pressing the pressing member against the second electronic component, the second lead may be bent to set the second electronic component to a target posture, and in the molding step, the first electronic component and the second component may be molded with the resin material to form the mold cover.

In the aspect of the present disclosure, the electronic component may be a sensor component that includes a package and a sensor element housed in the package.

DESCRIPTION OF EXEMPLARY EMBODIMENTS

Hereinafter, a method of manufacturing an electronic device according to an aspect of the present disclosure is described in detail based on embodiments shown in accompanying drawings.

Figure 1:
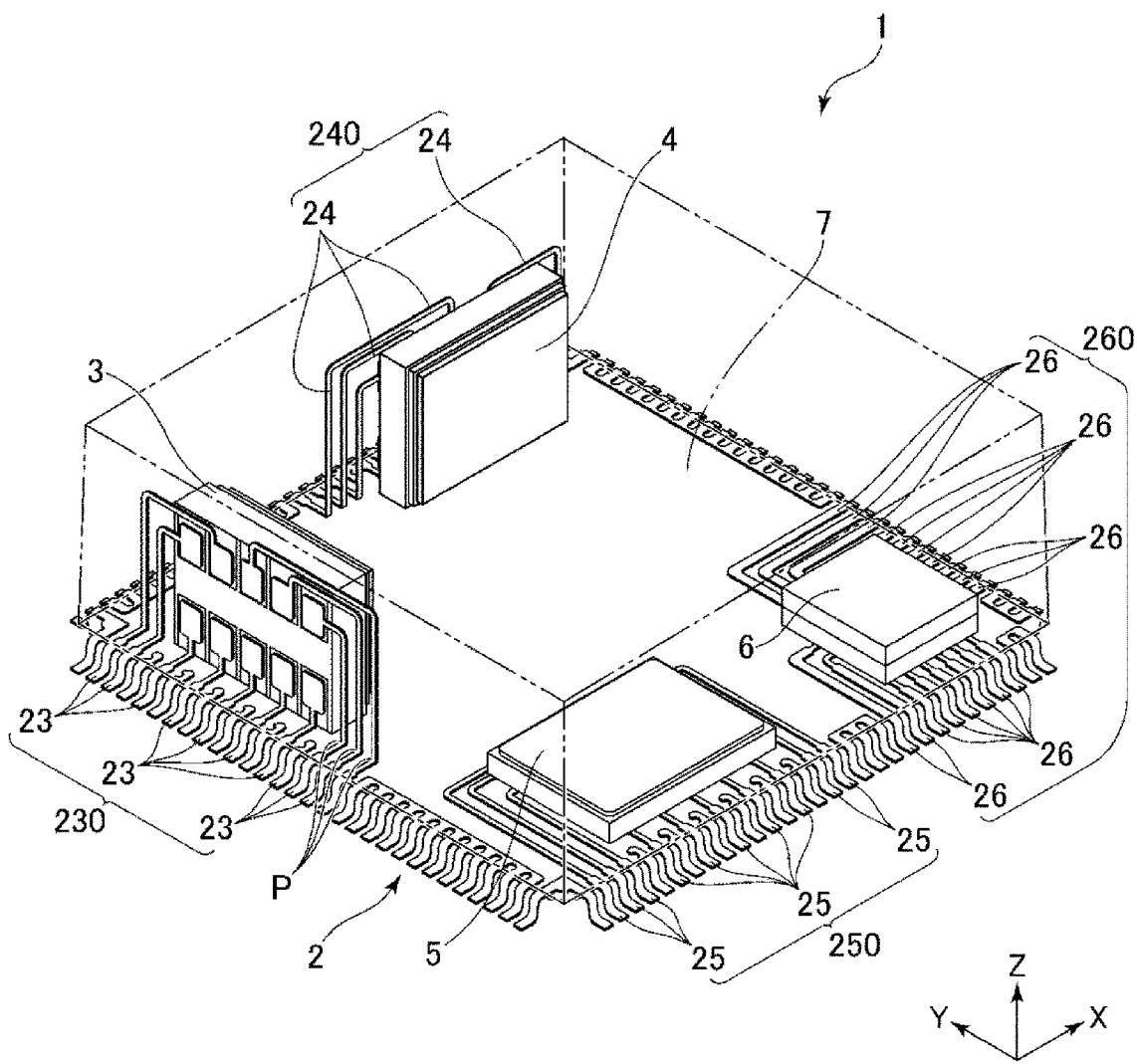
FIG. 1 is a perspective view schematically showing an electronic device.
Figure 2:
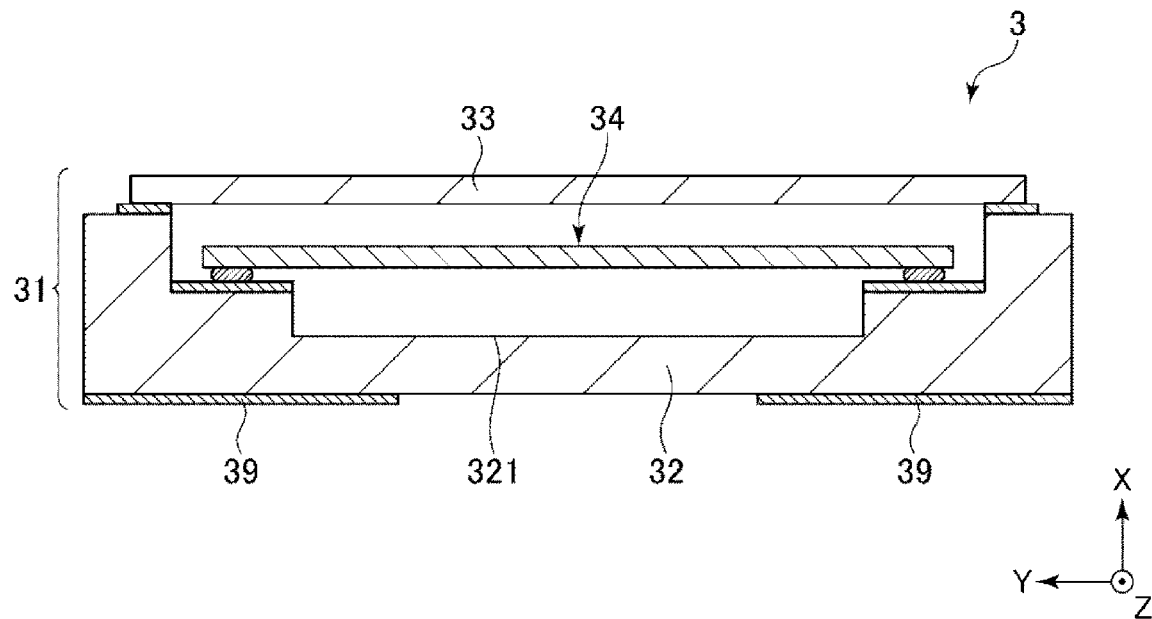
FIG. 2 is a cross-sectional view showing an example of an electronic component.
Figure 3:
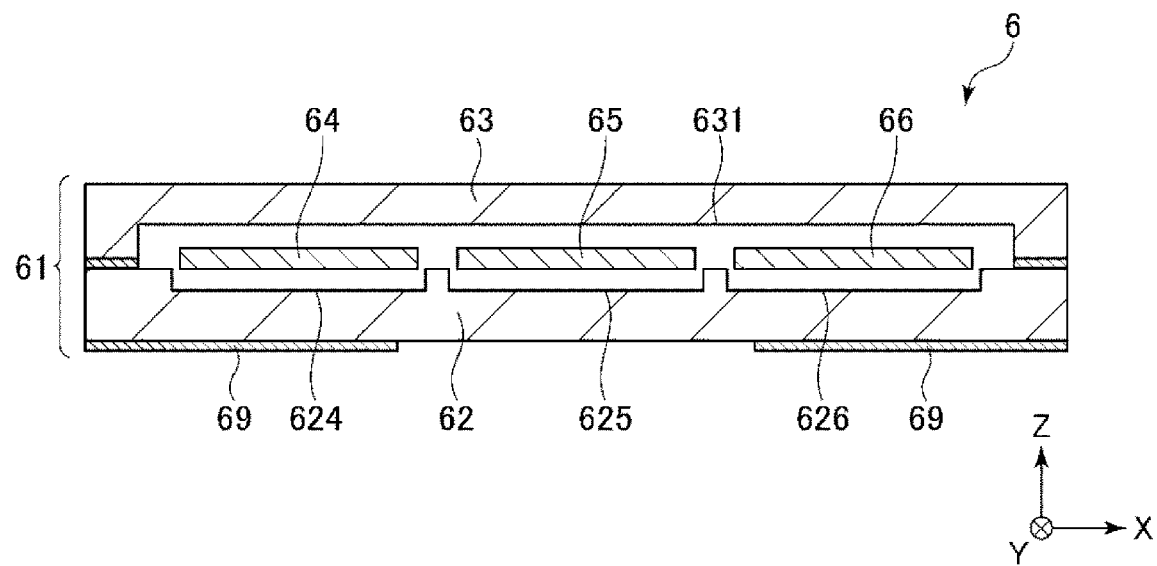
FIG. 3 is a cross-sectional view showing an example of an electronic component.
Figure 4:
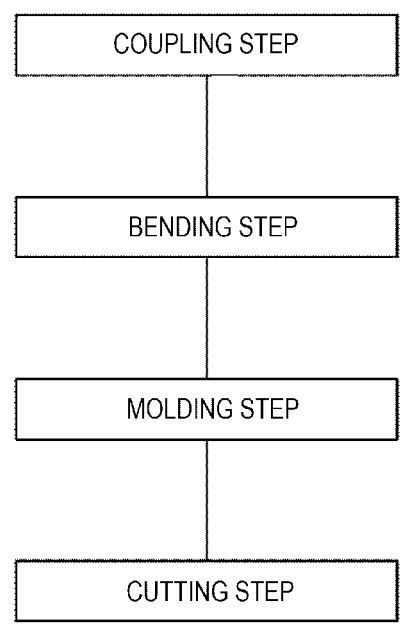
FIG. 4 is a diagram showing manufacturing steps of the electronic device shown in FIG. 1.

FIG. 1 is a perspective view schematically showing an electronic device. FIGS. 2 and 3 are cross-sectional views showing examples of electronic components, respectively. FIG. 4 is a diagram showing manufacturing steps of the electronic device shown in FIG. 1. FIGS. 5 to 10 are views for illustrating the method of manufacturing the electronic device shown in FIG. 1, respectively.

For convenience of illustration, in each figure, three axes orthogonal to one another are shown as an X axis, a Y axis, and a Z axis. A direction parallel to the X axis is also referred to as an "X axis direction", a direction parallel to the Y axis is also referred to as a "Y axis direction", and a direction parallel to the Z axis is also referred to as a "Z axis direction". Further, a tip end side of an arrow indicating each axis is also referred to as a "plus side", and an opposite side is also referred to as a "minus side". Further, a Z axis direction plus side is also referred to as "upper", and a Z axis direction minus side is also referred to as "lower".

First, an electronic device 1 manufactured by the method of manufacturing the electronic device of one aspect of the present disclosure is briefly described. The electronic device 1 includes a lead group 2 that includes a plurality of leads, an electronic component 3 as a first electronic component coupled to the lead group 2, an electronic component 4 as a second electronic component, electronic components 5 and 6, and a mold cover 7 that molds these four electronic components 3, 4, 5 and 6.

The electronic components 3, 4, 5 and 6 are sensor components, respectively. Specifically, among the electronic components 3, 4, 5 and 6, the electronic component 3 is an X-axis angular velocity sensor that detects an angular velocity around the X axis, the electronic component 4 is a Y-axis angular velocity sensor that detects an angular velocity around the Y axis, the electronic component 5 is a Z-axis angular velocity sensor that detects an angular velocity around the Z axis, and the electronic component 6 is a three-axis acceleration sensor that independently detects acceleration in the X axis direction, acceleration in the Y axis direction, and acceleration in the Z axis direction. That is, the electronic device 1 of this embodiment is a six-axis composite sensor.

However, a configuration of the electronic device 1 is not limited to the above, and at least one of the electronic components 3, 4, 5 and 6 may be omitted, or another electronic component may be added. Further, the electronic components 3, 4, 5 and 6 are not limited to a sensor component.

Next, the electronic components 3, 4 and 5 are briefly described. These electronic components 3, 4 and 5 have the same configuration, and are disposed to be inclined by 90° one another such that postures thereof correspond to respective detection axes. Therefore, hereinafter, the electronic component 3 is described as a representative, and a description of the electronic components 4 and 5 is omitted.

As shown in FIG. 2, the electronic component 3 includes a package 31 and a sensor element 34 housed in the package 31. The package 31 includes, for example, a base 32 having a recess 321 and a lid 33 that closes an opening of the recess 321 and that is joined to the base 32. A plurality of external terminals 39 are disposed at a lower surface of the base 32, and these external terminals 39 are electrically coupled to the sensor element 34, respectively. The sensor element 34 is, for example, a crystal vibrator having a drive arm and a detection arm. In this case, when an angular velocity is applied in a state where the drive arm is driven to vibrate, a detection vibration is excited in the detection arm by a Coriolis force, and the angular velocity can be obtained based on an electric charge generated in the detection arm by the detection vibration.

As mentioned above, although the electronic component 3 was described, a structure of the electronic component 3 is not specifically limited as long as a function thereof can be exhibited. For example, the sensor element 34 is not limited to the crystal vibrator, and may be, for example, a silicon structure or a configuration that detects an angular velocity based on a change in capacitance. Further, in this embodiment, although the electronic components 3, 4 and 5 have the same configuration, the present disclosure is not limited thereto and at least one may have a configuration different from others. Further, the electronic component 3 may be configured to detect not only the angular velocity around the X axis but also the angular velocity around other axes such as the Y axis and the Z axis in addition to the X axis. For example, when the electronic component 3 is configured to detect angular velocities around the X axis and the Y axis, the electronic component 4 can be omitted, and when the electronic component 3 is configured to detect angular velocities around the X axis, the Y axis and the Z axis, the electronic components 4 and 5 can be omitted.

Next, the electronic component 6 is briefly described. As shown in FIG. 3, the electronic component 6 includes a package 61 and three sensor elements 64, 65 and 66 housed in the package 61. The package 61 includes a base 62 and a lid 63. The base 62 has three recesses 624, 625 and 626 formed so as to overlap the sensor elements 64, 65 and 66. The lid 63 has a recess 631 that opens to the base 62 side, houses the sensor elements 64, 65 and 66 in the recess 631, and is joined to the base 62. A plurality of external terminals 69 are disposed at a lower surface of the base 62, and these external terminals 69 are electrically coupled to the sensor elements 64, 65 and 66, respectively.

The sensor element 64 is an element that detects the acceleration in the X axis direction, the sensor element 65 is an element that detects the acceleration in the Y axis direction, and the sensor element 66 is an element that detects the acceleration in the Z axis direction. These sensor elements 64, 65 and 66 have silicon structures, and the silicon structure includes a fixed electrode, and a movable electrode that forms a capacitance with the fixed electrode and that is displaced with respect to the fixed electrode when subjected to acceleration in a detection axis direction. In this case, the acceleration in the X axis direction can be detected based on a change in capacitance of the sensor element 64, the acceleration in the Y axis direction can be detected based on a change in capacitance of the sensor element 65, and the acceleration in the Z axis direction can be detected based on a change in capacitance of the sensor element 66.

As mentioned above, although the electronic component 6 was described, a configuration of the electronic component 6 is not specifically limited as long as a function thereof can be exhibited. For example, the sensor elements 64, 65 and 66 are not limited to the silicon structure, and may be, for example, a quartz crystal vibrator or may be configured to detect acceleration based on a charge generated by a vibration.

Next, the lead group 2 is described. As shown in FIG. 1, the lead group 2 includes a first lead group 230 having a plurality of leads 23 coupled to the electronic component 3, a second lead group 240 having a plurality of leads 24 coupled to the electronic component 4, a third lead group 250 having a plurality of leads 25 coupled to the electronic component 5, and a fourth lead group 260 having a plurality of leads 26 coupled to the electronic component 6.

The electronic component 3 and the respective leads 23, the electronic component 4 and the respective leads 24, the electronic component 5 and the respective leads 25, and the electronic component 6 and the respective leads 26 are respectively coupled mechanically and electrically via a conductive joining member (not shown) such as solder. Further, one end of each lead 23, 24, 25 and 26 protrudes outward from the mold cover 7. Hereinafter, a portion of each lead 23, 24, 25 and 26 that protrudes outward from the mold cover 7 is also referred to as an "outer portion".

The lead group 2 extends along an X-Y plane which includes the X axis and the Y axis. Further, in order to make the detection axis of the electronic component 3 coincide with the X axis, each lead 23 coupled to the electronic component 3 is bent, at a bending point P in the middle thereof, by 90° toward the Z axis direction. Similarly, in order to make the detection axis of the electronic component 4 coincide with the Y axis, each lead 24 coupled to the electronic component 4 is bent, at a bending point P in the middle thereof, by 90° toward the Z axis direction. On the other hand, each lead 25 coupled to the electronic component 5 and each lead 26 coupled to the electronic component 6 are not bent as the leads 23 and 24 respectively, and extend along the X-Y plane.

The mold cover 7 molds the four electronic components 3, 4, 5 and 6 to protect the electronic components 3, 4, 5 and 6 from moisture, dust, impact, and the like. A molding material which composes the mold cover 7 is not specifically limited, and for example, a thermosetting epoxy resin can be used and the molding material can be molded by a transfer mold method.

As mentioned above, the electronic device 1 was described. Next, the method of manufacturing the electronic device 1 is described. As shown in FIG. 4, the manufacturing step of the electronic device 1 includes a coupling step of coupling the electronic components 3, 4, 5 and 6 to the leads 23, 24, 25 and 26, a bending step of bending the leads 23 and 24, a molding step of molding the electronic components 3, 4, 5 and 6 with the resin material, and a cutting step of cutting the leads 23, 24, 25 and 26.

Coupling Step

Figure 5:
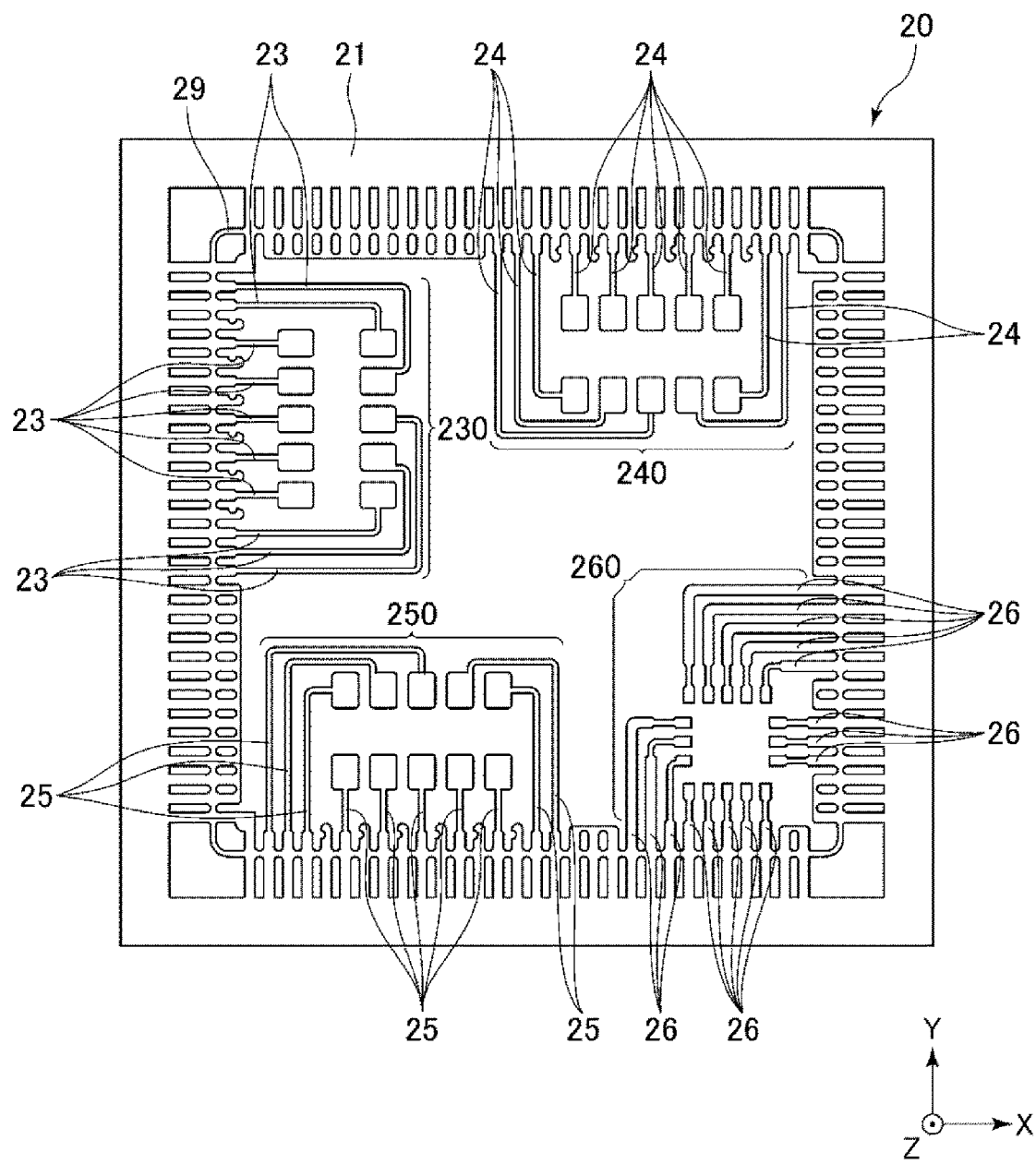
FIG. 5 is a view for illustrating a method of manufacturing the electronic device shown in FIG. 1.

First, as shown in FIG. 5, a lead frame 20 is prepared. The lead frame 20 includes a frame-shaped frame 21, a plurality of leads 23, 24, 25 and 26 that are located inward from the frame 21 and that are supported by the frame 21, and a tie bar 29 that couples these leads 23, 24, 25 and 26. The respective leads 23, 24, 25 and 26 are arranged along the X-Y plane.

Figure 6:
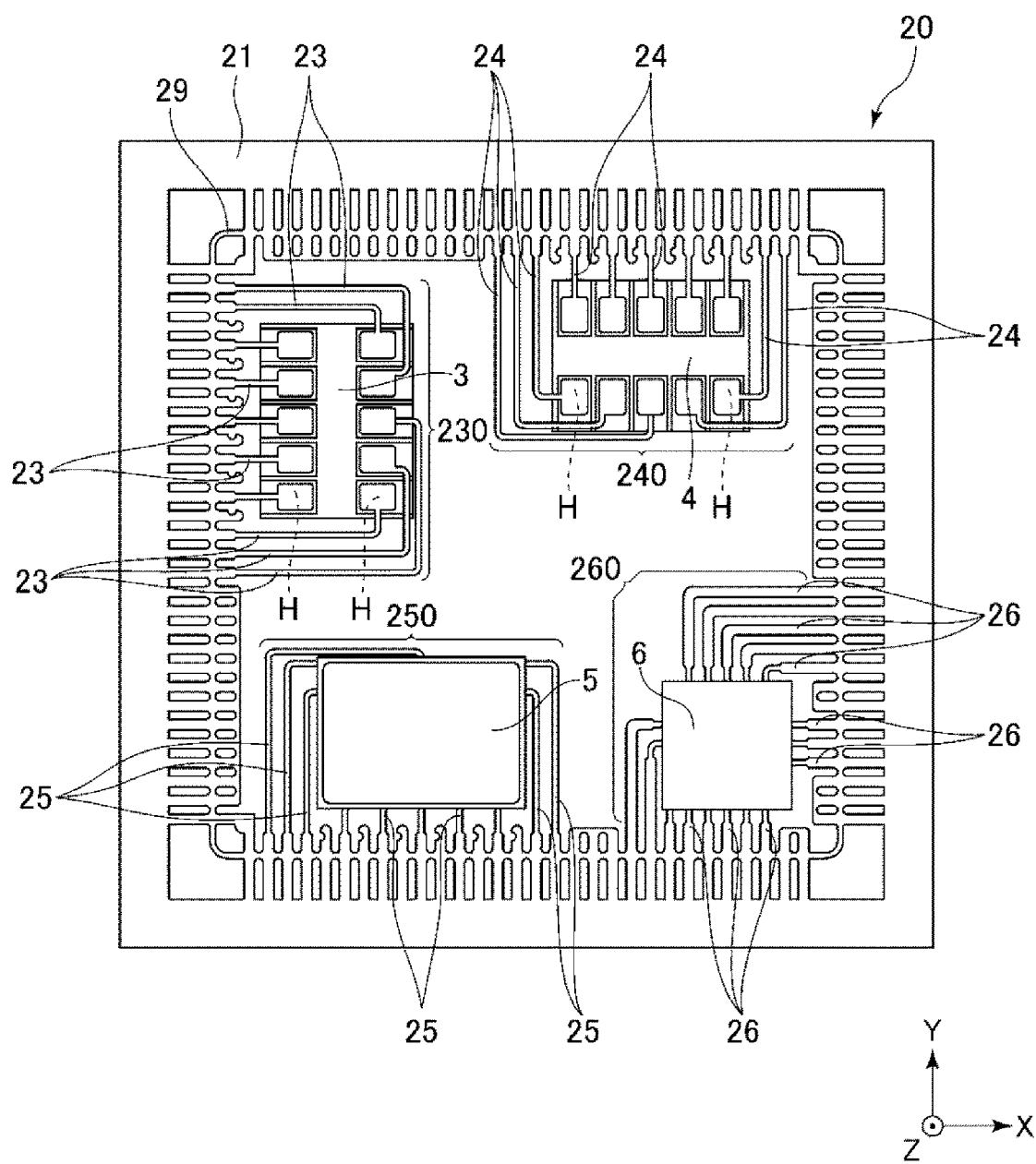
FIG. 6 is a view for illustrating the method of manufacturing the electronic device shown in FIG. 1.

Next, as shown in FIG. 6, the electronic component 3 is coupled to tip ends of the plurality of leads 23 (the first lead group 230) via a joining member H, the electronic component 4 is coupled to tip ends of the plurality of leads 24 (the second lead group 240) via a joining member H, the electronic component 5 is coupled to tip ends of the plurality of leads 25 (the third lead group 250) via a joining member H, and the electronic component 6 is coupled to tip ends of the plurality of leads 26 (the fourth lead group 260) via a joining member H. In this state, the detection axes of the electronic components 3, 4 and 5 coincide with the Z axis. In addition, amounting order of the electronic components 3, 4, 5 and 6 is not particularly limited, and for example, the electronic components 3, 4, 5 and 6 may be mounted one by one or all at the same time.

Thus, by coupling the electronic components 3, 4, 5 and 6 in a state where the lead frame 20 is flat, that is, before the leads 23 and 24 are bent, the electronic components 3, 4, 5 and 6 can be arranged in a plane along the X-Y plane. Therefore, each of the electronic components 3, 4, 5 and 6 can be mounted on the lead frame 20 from the Z axis direction, and mounting of the electronic components 3, 4, 5 and 6 onto the lead frame 20 is facilitated. In this embodiment, the electronic components 3 and 4 are coupled to the lead frame 20 from a Z axis direction minus side, and the electronic components 5 and 6 are coupled to the lead frame 20 from a Z axis direction plus side.

When the electronic components 3 and 4 are coupled to the leads 23 and 24 after the bending of the leads 23 and 24, at that time, a force may be applied to the leads 23 and 24 to cause unnecessary bending of the leads 23 and 24. Therefore, even though the bending is performed with high accuracy, a bending angle of the leads 23 and 24 deviates from a target value. Therefore, by coupling the electronic components 3 and 4 to the leads 23 and 24 before the leads 23 and 24 are bent, a posture of the electronic components 3 and 4 can be controlled with higher accuracy.

Bending Step

Next, in order to adjust the posture of the electronic component 3, the plurality of leads 23 are bent, at bending points P in the middle thereof, by 90° in the Z axis direction plus side, and the detection axis of the electronic component 3 coincides with the X axis. In addition, in order to adjust the posture of the electronic component 4, the plurality of leads 24 are bent, at bending points P in the middle thereof, by 90° in the Z axis direction plus side, and the detection axis of the electronic component 4 coincides with the Y axis. Hereinafter, the bending of the leads 23 and 24 is specifically described.

Figure 7:
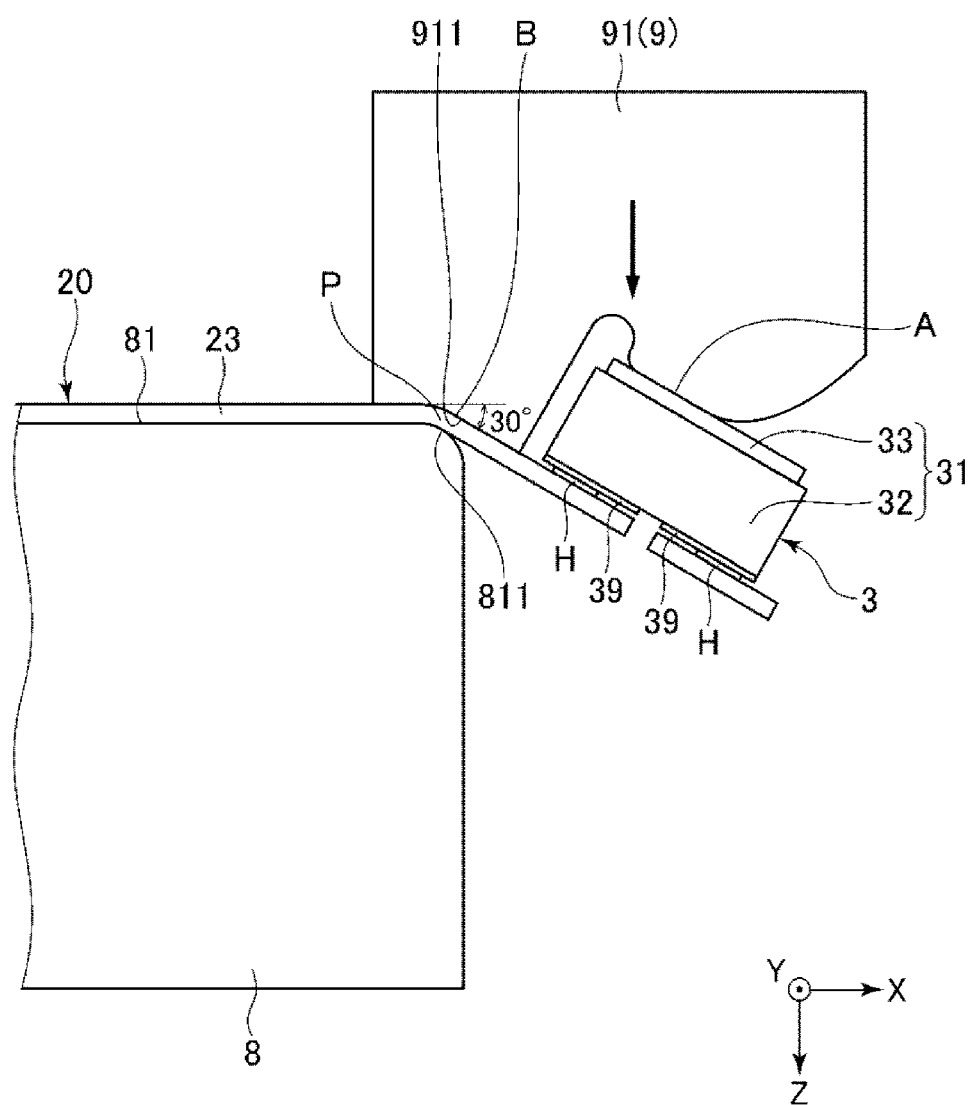
FIG. 7 is a view for illustrating the method of manufacturing the electronic device shown in FIG. 1.
Figure 8:
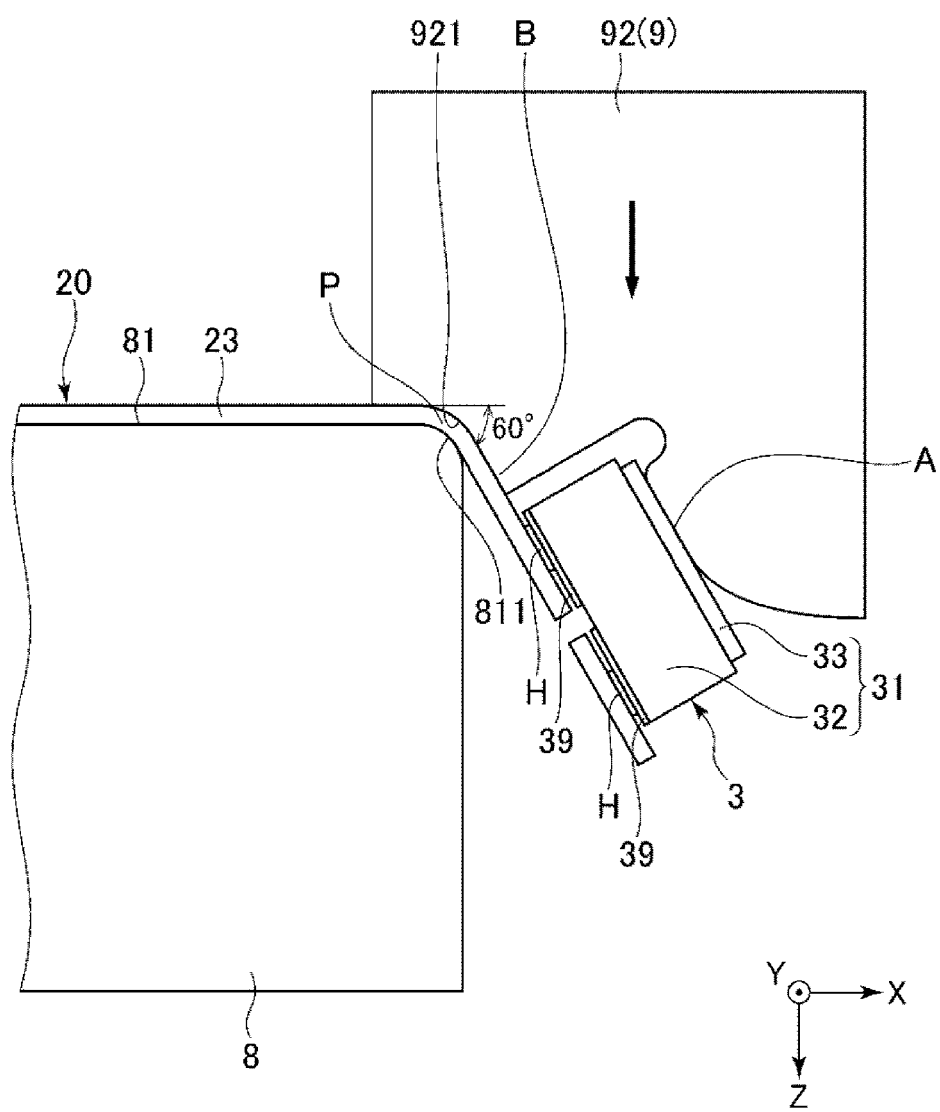
FIG. 8 is a view for illustrating the method of manufacturing the electronic device shown in FIG. 1.
Figure 9:
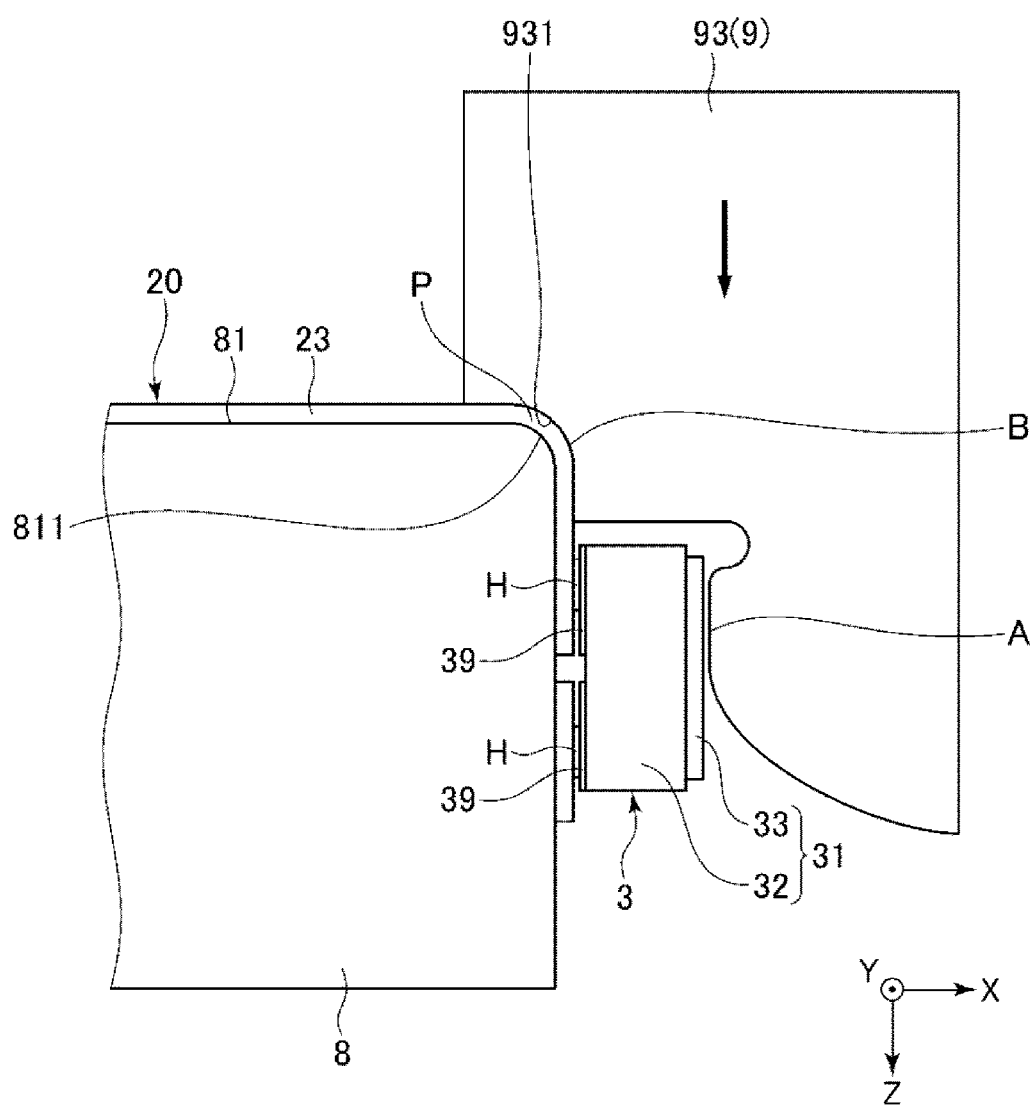
FIG. 9 is a view for illustrating the method of manufacturing the electronic device shown in FIG. 1.

As shown in FIGS. 7 to 9, in the bending step, a mounting table 8 on which the lead frame 20 is mounted and a pressing member 9 that presses and bends the lead frame 20 mounted on the mounting table 8 are used. A top surface of the mounting table 8 is a mounting surface 81 on which the lead frame 20 is mounted. Then, the lead frame 20 is mounted on the mounting surface 81 such that the bending points P of the leads 23 and 24 are positioned on an outer edge 811 of the mounting surface 81. The outer edge 811 is rounded such that an inner edge at the bending points P has an ideal radius of curvature r1. That is, the outer edge 811 is a 90° arc having the radius of curvature r1. However, a configuration of the mounting surface 81 is not limited thereto.

The pressing member 9 includes a first pressing member 91, a second pressing member 92, and a third pressing member 93, and by pressing the leads 23 and 24 in order by the three first, second, and third pressing members 91, 92 and 93, the leads 23 and 24 are bent in three steps. In particular, a bending step of the leads 23 and 24 performed by the first and second pressing members 91 and 92 is a first step of bending the leads 23 and 24 by pressing the electronic components 3 and 4, and a bending step of the leads 23 and 24 performed by the third pressing member 93 is a second step of bending the leads 23 and 24 by pressing the leads 23 and 24 without pressing the electronic components 3 and 4. It is preferable that the first, second and third pressing members 91, 92 and 93 are composed of hard materials, such as a metal, for example.

First Step

First, as shown in FIG. 7, the lead frame 20 is mounted on the mounting surface 81 such that the bending point P of the lead 23 is positioned at the outer edge 811. Next, the electronic component 3 is pressed by a part A of the first pressing member 91 from the Z axis direction minus side toward the plus side, and the lead 23 is bent by 30° with the bending point P as a fulcrum. The first pressing member 91 abuts against the mounting table 8 via the lead 23 at the same time as the lead 23 is bent by 30°, thereby restricting the bending of the leads 23 from exceeding 30°. Therefore, it is possible to prevent excessive bending of the lead 23 in this step.

In particular, a contact surface 911 of the first pressing member 91 with the lead 23 is in contact with the bending point P of the lead 23, and the outer edge at the bending point P is rounded so as to have an ideal radius of curvature r2. That is, the contact surface 911 is a 30° arc having the radius of curvature r2. According to such a configuration, since the lead 23 is deformed by pressing at a part B while sandwiching the bending point P of the lead 23 between the outer edge 811 of the mounting surface 81 and the contact surface 911 of the first pressing member 91, the lead 23 can be bent with an ideal curvature at the bending point P. However, a configuration of the first pressing member 91 is not limited thereto and, for example a bending angle of the lead 23 may not be 30°.

Next, as shown in FIG. 8, the electronic component 3 is pressed by a part A of the second pressing member 92 from the Z axis direction minus side toward the plus side, and the lead 23 is further bent by 30°, that is bent by 60° in total, with the bending point P as a fulcrum. The second pressing member 92 abuts against the mounting table 8 via the lead 23 at the same time as the lead 23 is bent to 60°, thereby restricting the bending of the lead 23 from exceeding 60°. Therefore, it is possible to prevent excessive bending of the lead 23 in this step.

In particular, a contact surface 921 of the second pressing member 92 with the lead 23 is in contact with the bending point P of the lead 23, and the outer edge at the bending point P is rounded so as to have an ideal radius of curvature r2. That is, the contact surface 921 is a 60° arc having the radius of curvature r2. According to such a configuration, since the lead 23 is deformed by pressing at a part B while sandwiching the bending point P of the lead 23 between the outer edge 811 of the mounting surface 81 and the contact surface 921 of the second pressing member 92, the lead 23 can be bent, at the bending point P, with an ideal curvature. However, a configuration of the second pressing member 92 is not limited thereto and, for example the bending angle of the lead 23 may not be 60°.

In the first step, at least one of the first and second pressing members 91 and 92 may not have the part B that abuts against the lead 23, and the electronic component 3 may be bent only by the part A.

Second Step

Next, as shown in FIG. 9, the lead 23 is pressed by the third pressing member 93 from the Z axis direction minus side, and the lead 23 is further bent by 30°, that is, bent by a target angle of 90° in total, with the bending point P as a fulcrum. When the lead 23 is bent, the third pressing member 93 contacts only the lead 23 and is not in contact with the electronic component 3. That is, a part B of the third pressing member 93 is in contact with the lead 23, but a part A is not in contact with the electronic component 3. The third pressing member 93 abuts against the mounting table 8 via the lead 23 at the same time as the lead 23 is bent to 90°, thereby restricting the bending of the lead 23 from exceeding 90°. Therefore, it is possible to prevent excessive bending of the lead 23 in this step.

In particular, a pressing surface 931 of the third pressing member 93 that presses the lead 23 presses the bending point P of the lead 23 and a flat part at an electronic component 3 side from the bending point P, and the outer edge at the bending point P is rounded so as to have the ideal radius of curvature r2. That is, the pressing surface 931 is configured with a 90° arc portion having the radius of curvature r2 and a flat portion continued thereto. According to such a configuration, the outer edge 811 of the mounting surface 81 and the pressing surface 931 of the third pressing member 93 sandwich the bending point P of the lead 23 and the flat portion at the electronic component 3 side from the bending point P, and the lead 23 can be bent in an ideal shape. However, a configuration of the third pressing member 93 is not limited thereto and, for example the bending angle of the lead 23 may not be 90°.

According to the above steps, the posture of the electronic component 3 is adjusted by bending the lead 23 at the bending point P by 90°, and the detection axis of the electronic component 3 coincides with the X axis. It is preferable that the lead 23 is bent with an extremely small error with respect to 90°. Thereby, sensitivity of the electronic component 3 to the other axis, that is, sensitivity to the angular velocity around the Y axis and the angular velocity around the Z axis can be sufficiently lowered, and the angular velocity around the X axis can be detected more accurately.

Further, by bending the lead 23 by 90° at the bending point P in a plurality of steps, in this embodiment, three steps, a return deformation after the bending of the lead 23, that is, a deformation to return to a shape before a bending deformation can be effectively prevented. The return deformation after bending performed by the first pressing member 91 can be canceled by bending performed by the second pressing member 92, and the return deformation after bending performed by the second pressing member 92 can be canceled by bending performed by the third pressing member 93. Since the smaller an angle of bending in one bending step, the smaller an amount of return deformation, the final amount of return deformation of the lead 23 can be sufficiently reduced according to such a method.

In particular, in the bending of the lead 23 performed by the third pressing member 93, the lead 23 is bent by pressing the third pressing member 93 against the lead 23 without pressing the third pressing member 93 against the electronic component 3. Therefore, the lead 23 can be bent without being affected by a dimensional error of the package 31 of the electronic component 3 or a thickness error of the joining member H. Therefore, the lead 23 can be bent by 90° with higher accuracy. In the bending of the lead 23 performed by the third pressing member 93, the part B of the third pressing member 93 presses the flat part on the electronic component 3 side from the bending point P of the lead 23, and a press mark is formed at the pressed portion of the lead 23, but performance of the lead 23 and the electronic component 3 is not affected.

In the bending step of the lead 23 performed by the first and second pressing members 91 and 92, the lead 23 is bent by pressing the first and second pressing members 91 and 92 against the electronic component 3 at the part A. Therefore, a separation distance between the bending point P as the fulcrum and a contact point (part A) with the first and second pressing members 91 and 92 as a force point can be increased as much as possible, and the lead 23 can be appropriately bent with a smaller force. Therefore, stress applied to the lead frame 20 can be reduced.

Next, in the similar manner as the bending of the lead 23, by bending the lead 24 by 90° at the bending point P, the posture of the electronic component 4 is adjusted, and the detection axis of the electronic component 4 coincides with the Y axis. That is, first, the lead frame 20 is mounted on the mounting surface 81 such that the bending point P of the lead 24 is positioned at the outer edge 811. Next, the electronic component 4 is pressed by the first pressing member 91 from the Z axis direction minus side, and the lead 24 is bent by 30° with the bending point P as a fulcrum. Next, the electronic component 4 is pressed by the second pressing member 92 from the Z axis direction minus side, the lead 24 is bent by 30° with the bending point P as a fulcrum, the lead 24 is pressed by the third pressing member 93 from the Z axis direction minus side, and the lead 24 is bent by 30° with the bending point P as a fulcrum. Therefore the lead 24 is bent by 90° at the bending point P. Thereby, an effect similar to the effect mentioned above can be exhibited.

In this embodiment, the lead 24 is bent to 90° that is the target angle after the lead 23 is bent to 90° that is the target angle, but the processing order is not particularly limited. For example, the lead 23 may be bent to 90° after the lead 24 is bent to 90°, or the leads 23 and 24 may be bent to 90° at the same time. The same time means that the first pressing member 91 bends the leads 23 and 24 to 30° sequentially or at the same time, next, the second pressing member 92 bends the leads 23 and 24 to 60° sequentially or at the same time, and next, the third pressing member 93 bends the leads 23 and 24 to 90° sequentially or at the same time.

Molding Step

Figure 10:
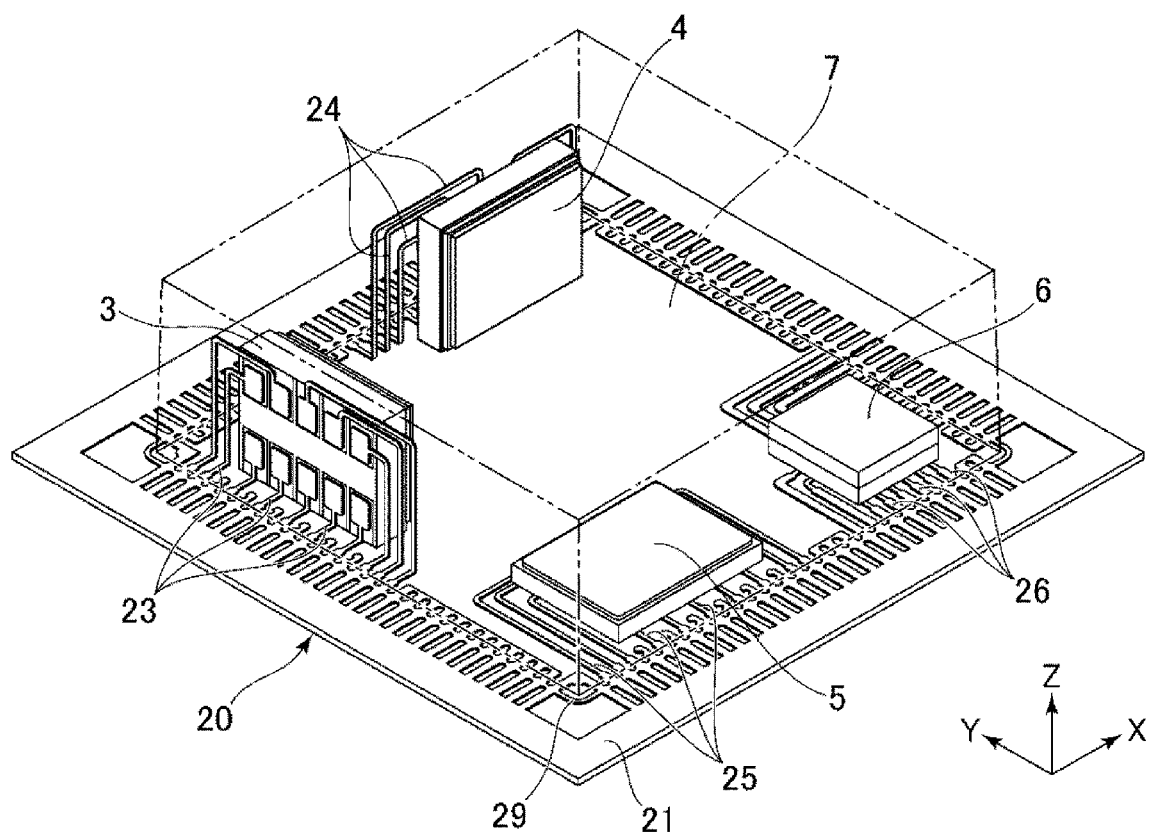
FIG. 10 is a view for illustrating the method of manufacturing the electronic device shown in FIG. 1.

Next, a structure after bending is covered with a mold, and as shown in FIG. 10, a mold cover 7 that covers the electronic components 3, 4, 5 and 6 is formed by transfer molding. Thereby, the electronic components 3, 4, 5 and 6 are resin-sealed. The molding material which composes the mold cover 7 is not specifically limited, and for example, the thermosetting epoxy resin can be used.

Cutting Step

Next, the frame 21 is cut and removed from the lead frame 20, and outer portions of the leads 23, 24, 25 and 26 are bent into a predetermined shape. Next, the tie bar 29 that couples the leads 23, 24, 25 and 26 one another is cut and removed by a laser or the like. As described above, the electronic device 1 shown in FIG. 1 is manufactured.

The method of manufacturing the electronic device 1 was described above. As described above, the method of manufacturing such an electronic device 1 in which the electronic components 3, 4, 5 and 6 coupled to the leads 23, 24, 25 and 26 are covered with the mold cover 7 includes a coupling step of coupling the electronic components 3, 4, 5 and 6 to the leads 23, 24, 25 and 26, a bending step of bending the leads 23 and 24 to adjust the postures of the electronic components 3 and 4, and a molding step of molding the electronic components 3, 4, 5 and 6 with the resin material to form the mold cover 7. Further, the bending step includes a lead bending step of bending the leads 23 and 24 by pressing the pressing member 9 against the leads 23 and 24 without pressing the pressing member 9 against the electronic components 3 and 4. By including such a lead bending step, the leads 23 and 24 can be bent without being affected by, for example, a package dimensional error of the electronic components 3 and 4, a thickness error of the joining member H, and the like. Therefore, the leads 23 and 24 can be bent to the target angle with higher accuracy.

Further, as described above, the bending step includes the first step of bending the leads 23 and 24 to the angle less than the target angle and the second step of bending the lead 23 to the target angle. Further, the second step is performed in the lead bending step of bending the leads 23 and 24 by pressing the pressing member 9 against the leads 23 and 24 without pressing the pressing member 9 against the electronic components 3 and 4. In this way, in the final bending step, by pressing the pressing member 9 against the leads 23 and 24 and bending the leads 23 and 24, the leads 23 and 24 can be bent to the target angle with higher accuracy. Further, by performing the bending step a plurality of times, the leads 23 and 24 can be gradually bent, and a final amount of return deformation of the leads 23 and 24 can be sufficiently reduced.

However, the first step may be omitted. The first step may be performed, similarly with the second step, in the lead bending step of bending the leads 23 and 24 by pressing the pressing member 9 against the leads 23 and 24 without pressing the pressing member 9 against the electronic components 3 and 4.

Further, as described above, in the first step, the leads 23 and 24 are bent to the angle less than the target angle by pressing the pressing member 9 against the electronic components 3 and 4. High accuracy is not required for bending the leads 23 and 24 to the angle less than the target angle. Therefore, even if the bending angle of the leads 23 and 24 is affected by the package dimensional error of the electronic components 3 and 4, the thickness error of the joining member H, and the like, there is no particular problem. Then, by pressing the electronic components 3 and 4 by the pressing member 9, the force point can be sufficiently moved away from the bending point P, so that the leads 23 and 24 can be appropriately bent with a smaller force. Therefore, damage at the time of manufacturing the electronic device 1 can be effectively prevented.

Further, as described above, the first step is performed a plurality of times. Thereby, the bending angle of the leads 23 and 24 in the first step performed one of the plurality of times can be further reduced. Therefore, the final amount of return deformation of the leads 23 and 24 can be further reduced. In this embodiment, the first step is performed twice, but the disclosure is not limited thereto, and the first step may be performed once or three times or more.

As described above, the electronic device 1 includes, as electronic components, the electronic component 3 that is the first electronic component and the electronic component 4 that is the second electronic component, and includes, as leads, the lead 23 that is a first lead to which the electronic component 3 is coupled and the lead 24 that is a second lead to which the electronic component 4 is coupled. Further, in the coupling step, the electronic component 3 is coupled to the lead 23, the electronic component 4 is coupled to the lead 24, and the electronic component 3 and the electronic component 4 are arranged in a plane. In the bending step, the lead 23 is bent to set the electronic component 3 to the target posture, and the lead 24 is bent to set the electronic component 4 to the target posture. Thus, by arranging the electronic components 3 and 4 on the leads 23 and 24 in a plane, the electronic components 3 and 4 can be easily coupled to the leads 23 and 24.

However, the present disclosure is not limited to the above, and for example, any one of the electronic components 3 and 4 may be omitted.

Further, as described above, the electronic component 3 is a sensor component that includes the package 31 and the sensor element 34 housed in the package 31. Thus, when the electronic component 3 includes the package 31, the package 31 was pressed by the pressing member 9 and the lead 23 was bent, the bending angle of the lead 23 may be deviated due to the dimensional error of the package 31. Therefore, as in this embodiment, by pressing the lead 23 instead of the package 31 with the pressing member 9 and bending the lead 23, the lead 23 can be bent to the target angle without being affected by the dimensional error of the package 31. The same applies to the electronic component 4.

However, the present disclosure is not limited to the above, and the electronic components 3 and 4 may not respectively include the package. Further, the electronic components 3 and 4 may not respectively be the sensor component. In this embodiment, the electronic components 3 and 4 are sensor components, the detection target is the angular velocity, but the detection target is not limited thereto and may be, for example, acceleration, pressure, temperature, or the like.

As mentioned above, although the method of manufacturing the electronic device according to this disclosure was described based on illustrated embodiments, the present disclosure is not limited thereto, and a configuration of each part can be replaced with any configuration having a similar function. In addition, any other component may be added to the present disclosure.

What is claimed is:

1. A method of manufacturing an electronic device in which at least one electronic component coupled to a lead is covered with a mold cover, the method of manufacturing an electronic device comprising:
   a coupling step of coupling a first electronic component to a first lead;

a bending step of bending the first lead to adjust a posture of the first electronic component; and following the bending step, a molding step of molding the first electronic component with a resin material to form the mold cover, wherein the bending step preventing return deformation of the first lead, the bending step comprises:

a first step of bending the first lead to a first angle of not more than 30 degrees, the first angle being less than a target angle by pressing a first pressing member against the first electronic component to move the first electronic component toward a mounting table supporting a lead frame of the electronic device during manufacture;

a second step of bending the first lead to a second angle of not less than 30 degrees and not more than 60 degrees, the second angle being less than the target angle by pressing a second pressing member against the first electronic component to move the first electronic component toward the mounting table supporting the lead frame of the electronic device during manufacture; and a third step of bending the first lead to the target angle by pressing a third pressing member against the first lead in a first direction without pressing the third pressing member against the first electronic component to move the first electronic component toward the mounting table supporting the lead frame of the electronic device during manufacture, a portion of the third pressing member overlaps the first electronic component in a second direction tangential to the first direction without contacting the first electronic component.

2. The method of manufacturing an electronic device according to claim 1, wherein
the first step is performed a plurality of times.

3. The method of manufacturing an electronic device according to claim 1, wherein
the electronic device further includes:
a second electronic component and a second lead coupled to the second electronic component,
in the coupling step,
the first electronic component is coupled to the first lead, the second electronic component is coupled to the second lead, and the first electronic component and the second electronic component are arranged in a plane,
in the bending step,
by pressing the third pressing member against the first lead without pressing the third pressing member against the first electronic component, the first lead is bent to set the first electronic component to a target posture, and by pressing the third pressing member against the second lead without pressing the third pressing member against the second electronic component, the second lead is bent to set the second electronic component to the target posture, and
in the molding step,
the first electronic component and the second electronic component are molded with the resin material to form the mold cover.

4. The method of manufacturing an electronic device according to claim 1, wherein
the electronic component is a sensor component that includes a package and a sensor element housed in the package.

* * * * *